(12) United States Patent
Nishino et al.

(10) Patent No.: US 12,398,460 B2
(45) Date of Patent: Aug. 26, 2025

(54) SUBSTRATE PROCESSING APPARATUS, FURNACE OPENING ASSEMBLY, SUBSTRATE PROCESSING METHOD, METHOD OF MANUFACTURING SEMICONDUCTOR DEVICE AND NON-TRANSITORY TANGIBLE MEDIUM

(71) Applicant: Kokusai Electric Corporation, Tokyo (JP)

(72) Inventors: Tatsuya Nishino, Toyama (JP); Akinori Tanaka, Toyama (JP); Akira Horii, Toyama (JP); Tomoshi Taniyama, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 539 days.

(21) Appl. No.: 17/682,210

(22) Filed: Feb. 28, 2022

(65) Prior Publication Data
US 2022/0298627 A1  Sep. 22, 2022

(30) Foreign Application Priority Data
Mar. 22, 2021 (JP) ................................. 2021-046756

(51) Int. Cl.
C23C 16/44 (2006.01)
C23C 16/40 (2006.01)
C23C 16/56 (2006.01)

(52) U.S. Cl.
CPC ........ *C23C 16/4405* (2013.01); *C23C 16/403* (2013.01); *C23C 16/405* (2013.01); *C23C 16/56* (2013.01)

(58) Field of Classification Search
CPC .............................................. C23C 16/4405
See application file for complete search history.

(56) References Cited

U.S. PATENT DOCUMENTS

| | | |
|---|---|---|
| 2013/0252434 A1 | 9/2013 | Yuasa et al. |
| 2015/0267296 A1 | 9/2015 | Nishida et al. |

(Continued)

FOREIGN PATENT DOCUMENTS

| | | | | |
|---|---|---|---|---|
| CN | 103985632 A | * | 8/2014 | ......... H01L 21/6719 |
| JP | 2002-009010 A | | 1/2002 | |

(Continued)

OTHER PUBLICATIONS

Singapore Written Opinion issued on Jul. 11, 2023 for Singapore Patent Application No. 10202201914S.

(Continued)

*Primary Examiner* — Peter Bradford
(74) *Attorney, Agent, or Firm* — Volpe Koenig

(57) ABSTRACT

There is provided a technique capable of reducing a corrosion of a furnace opening shutter. According to one aspect thereof, a substrate processing apparatus includes: a process vessel provided with an opening and a first sealing surface around the opening; and a furnace opening shutter provided with a second sealing surface facing the first sealing surface, and capable of closing the opening. The furnace opening shutter includes: a protective cover provided corresponding to an inner surface of the furnace opening shutter, facing the process vessel and greater than the opening; and a lid provided corresponding to an outer surface of the furnace opening shutter and supporting the protective cover. The second sealing surface is configured by an outer peripheral portion of the protective cover and the lid, and a purge gas is supplied to a gap between the first sealing surface and the second sealing surface.

14 Claims, 6 Drawing Sheets

(56) References Cited

U.S. PATENT DOCUMENTS

| | | | |
|---|---|---|---|
| 2015/0279712 A1* | 10/2015 | Yachi | H01L 21/67196 |
| | | | 438/795 |
| 2016/0362784 A1 | 12/2016 | Isobe et al. | |
| 2017/0335452 A1 | 11/2017 | Yamazaki et al. | |
| 2020/0066551 A1 | 2/2020 | Okajima et al. | |
| 2020/0149159 A1 | 5/2020 | Okajima et al. | |

FOREIGN PATENT DOCUMENTS

| | | | |
|---|---|---|---|
| JP | 2002025911 A * | 1/2002 | |
| JP | 2007-073746 A | 3/2007 | |
| JP | 2008-078285 A | 4/2008 | |
| JP | 2010-021385 A | 1/2010 | |
| JP | 2011-171657 A | 9/2011 | |
| JP | 2015-185662 A | 10/2015 | |
| JP | 2017-005090 A | 1/2017 | |
| JP | 2018-022773 A | 2/2018 | |
| JP | 2020-035779 A | 3/2020 | |
| KR | 10-2020-0094893 A | 8/2020 | |
| KR | 102447175 B1 * | 9/2020 | |

OTHER PUBLICATIONS

Taiwan Office Action issued on May 2, 2023 for Taiwan Patent Application No. 111105421.

* cited by examiner

SUBSTRATE PROCESSING APPARATUS, FURNACE OPENING ASSEMBLY, SUBSTRATE PROCESSING METHOD, METHOD OF MANUFACTURING SEMICONDUCTOR DEVICE AND NON-TRANSITORY TANGIBLE MEDIUM

CROSS-REFERENCE TO RELATED PATENT APPLICATION

This non-provisional U.S. patent application claims priority under 35 U.S.C. § 119 of Japanese Patent Application No. 2021-046756, filed on Mar. 22, 2021, in the Japanese Patent Office, the entire contents of which are hereby incorporated by reference.

BACKGROUND

1. Field

The present disclosure relates to a substrate processing apparatus, a furnace opening assembly, a substrate processing method, a method of manufacturing a semiconductor device and a non-transitory tangible medium.

2. Related Art

As a part of a manufacturing process of a semiconductor device, for example, a film-forming step of forming a film on a substrate such as a semiconductor wafer may be performed. The film-forming step is performed by supplying a process gas to a process chamber in which the substrate is accommodated. The film-forming step is performed to form the film on a surface of the substrate. However, in reality, deposits containing a substance of the film may adhere to a location such as an inner wall of the process chamber as well as the surface of the substrate. The deposits may accumulatively adhere to the location whenever the film-forming step is performed. When a thickness of the deposits reaches a certain thickness or more, the deposits may be peeled off from the location such as the inner wall of the process chamber. As a result, foreign substances (particles) may be generated in the process chamber. Therefore, whenever the thickness of the deposits reaches the certain thickness, it is preferable to clean an inside of the process chamber or components in the process chamber by removing the deposits. As a method of removing the deposits, a dry cleaning process is disclosed in which an empty boat is transferred (loaded) into the process chamber and an etching gas (which is a cleaning gas) is supplied to remove the deposits by a dry etching process.

However, the boat may not be cleaned. Therefore, a cleaning process may be performed by using a furnace opening shutter which is normally closed to maintain an inside of a furnace warm and to shield a transfer chamber from a heat when the boat is lowered. However, since the cleaning process uses a gas highly corrosive to metal, the furnace opening shutter may be corroded.

SUMMARY

According to the present disclosure, there is provided a technique capable of reducing a corrosion of a furnace opening shutter.

According to one or more embodiments of the present disclosure, there is provided a technique related to a substrate processing apparatus including: a process vessel provided with an opening through which a substrate retainer accommodating a substrate is transferred and a first sealing surface around the opening; and a furnace opening shutter provided with a second sealing surface facing the first sealing surface, and capable of closing the opening in a state where the substrate retainer is not accommodated in the process vessel, wherein the furnace opening shutter includes: a protective cover provided corresponding to an inner surface of the furnace opening shutter, facing the process vessel and greater than the opening; and a lid provided corresponding to an outer surface of the furnace opening shutter and supporting the protective cover, wherein the second sealing surface is configured by an outer peripheral portion of the protective cover and the lid, and a purge gas is supplied to a gap between the first sealing surface and the second sealing surface from a location radially more outward than the outer peripheral portion of the protective cover.

DETAILED DESCRIPTION

Embodiments

Figure 1:
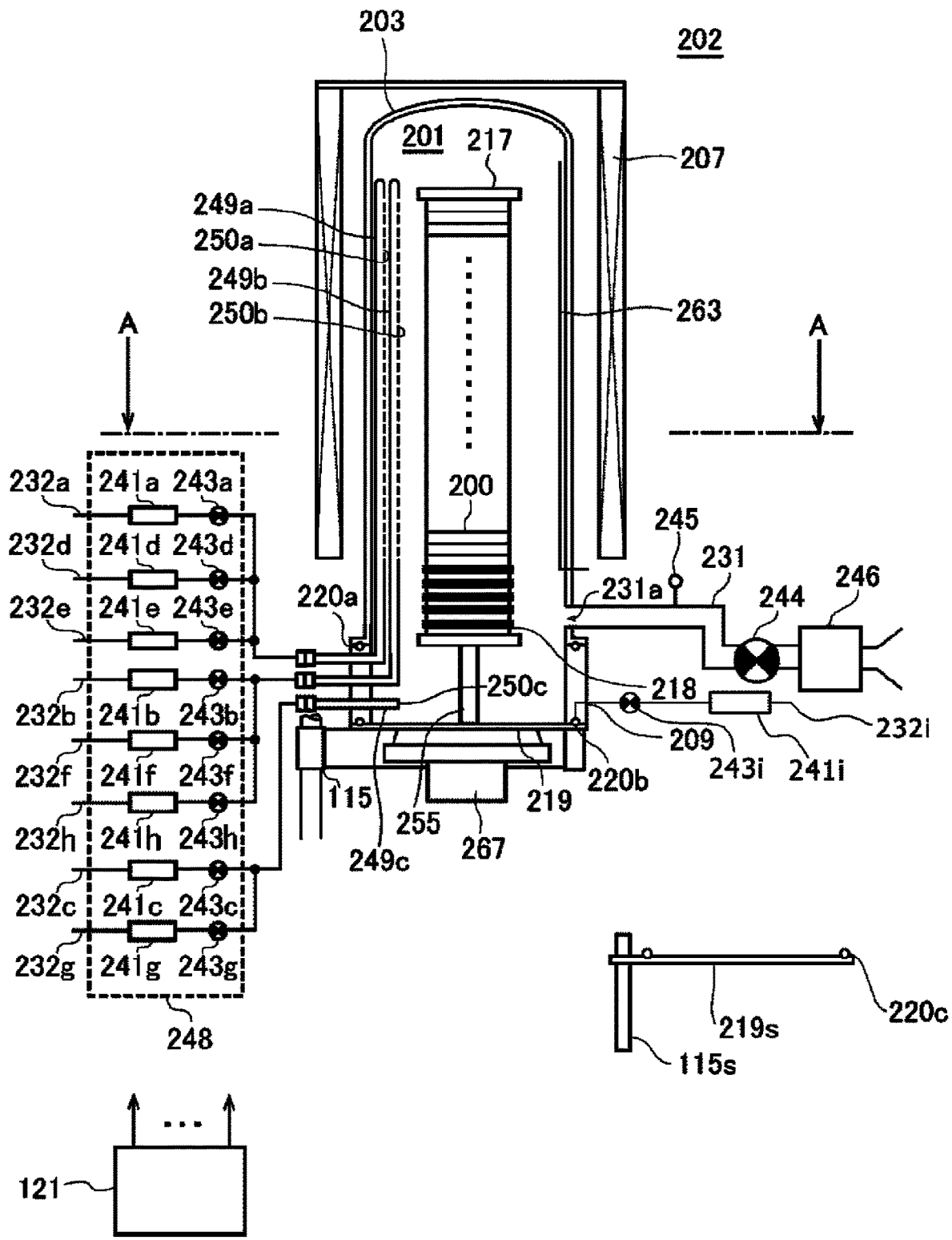
FIG. 1 is a diagram schematically illustrating a vertical cross-section of a vertical type process furnace of a substrate processing apparatus preferably used in one or more embodiment of the present disclosure, wherein a process furnace 202 is schematically illustrated.

Hereinafter, one or more embodiments (also simply referred to as "embodiments") according to the technique of the present disclosure will be mainly described with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

As shown in FIG. 1, a substrate processing apparatus according to the present embodiments includes a process furnace 202. The process furnace 202 is provided with a heater 207 serving as a temperature regulator (which is a heating structure or a heating system). The heater 207 is of a cylindrical shape, and is vertically installed while being supported by a support plate (not shown). The heater 207 also functions as an activator (also referred to as an "exciter") capable of activating (exciting) a gas such as a process gas by a heat.

A reaction tube 203 is provided in an inner side of the heater 207 to be aligned in a manner concentric with the heater 207. For example, the reaction tube 203 is made of a heat resistant material such as quartz ($SiO_2$) and silicon carbide (SiC). The reaction tube 203 is of a cylindrical shape with a closed upper end and an open lower end. A manifold 209 is provided under the reaction tube 203 to be aligned in a manner concentric with the reaction tube 203. For example, the manifold 209 is made of a metal such as stainless steel (SUS). The manifold 209 is of a cylindrical shape with open upper and lower ends. The upper end of the manifold 209 is engaged with the lower end of the reaction tube 203 so as to support the reaction tube 203. An O-ring 220a serving as a seal is provided between the manifold 209 and the reaction tube 203. Similar to the heater 207, the reaction tube 203 is installed vertically. A process vessel (also referred to as a "reaction vessel") is constituted mainly by the reaction tube 203 and the manifold 209. A process chamber 201 is provided in a hollow cylindrical portion of the process vessel. The process chamber 201 is configured to accommodate a plurality of wafers including a wafer 200 serving as a substrate. Hereinafter, the plurality of wafers including the wafer 200 may also be simply referred to as "wafers 200". The wafers 200 are processed in the process chamber 201.

Nozzles 249a, 249b and 249c are provided in the process chamber 201 so as to penetrate a side wall of the manifold 209. The nozzles 249a, 249b and 249c serve as a first supplier (which is a first supply structure), a second supplier (which is a second supply structure) and a third supplier (which is a third supply structure), respectively. The nozzles 249a, 249b and 249c may also be referred to as a first nozzle, a second nozzle and a third nozzle, respectively. For example, each of the nozzles 249a, 249b and 249c is made of a heat resistant material such as quartz and silicon carbide. Gas supply pipes 232a, 232b and 232c are connected to the nozzles 249a, 249b and 249c, respectively. The nozzles 249a, 249b and 249c are different nozzles, and the nozzles 249a and 249b are provided adjacent to each other.

Mass flow controllers (also simply referred to as "MFCs") 241a, 241b and 241c serving as flow rate controllers (flow rate control structures) and valves 243a, 243b and 243c serving as opening/closing valves are sequentially installed at the gas supply pipes 232a, 232b and 232c, respectively, in this order from upstream sides to downstream sides of the gas supply pipes 232a, 232b and 232c in a gas flow direction. Gas supply pipes 232d and 232e are connected to the gas supply pipe 232a at a downstream side of the valve 243a of the gas supply pipe 232a. Gas supply pipes 232f and 232h are connected to the gas supply pipe 232b at a downstream side of the valve 243b of the gas supply pipe 232b. A gas supply pipe 232g is connected to the gas supply pipe 232c at a downstream side of the valve 243c of the gas supply pipe 232c. MFCs 241d, 241e, 241f, 241g and 241h and valves 243d, 243e, 243f, 243g and 243h are sequentially installed at the gas supply pipes 232d, 232e, 232f, 232g and 232h, respectively, in this order from upstream sides to downstream sides of the gas supply pipes 232d, 232e, 232f, 232g and 232h in the gas flow direction. Each of the gas supply pipes 232a through 232h is made of a metal material such as stainless steel (SUS).

Figure 2:
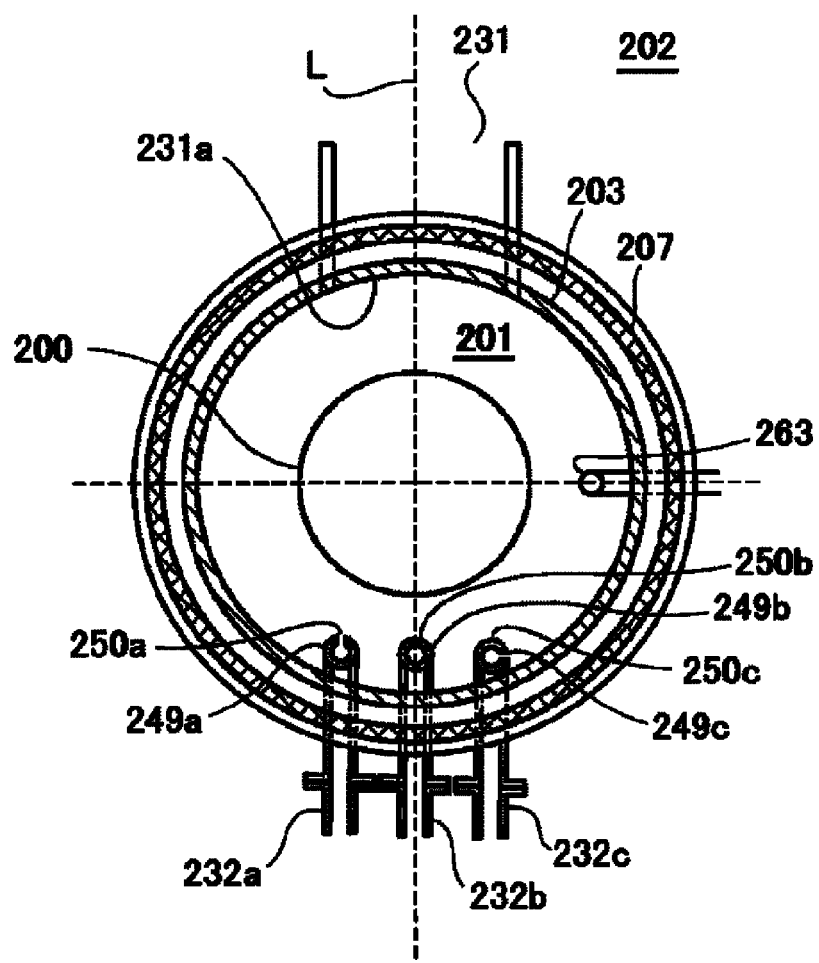
FIG. 2 is a diagram schematically illustrating a horizontal cross-section taken along the line A-A of the process furnace 202 of the substrate processing apparatus shown in FIG. 1 preferably used in the embodiments of the present disclosure

As shown in FIG. 2, each of the nozzles 249a and 249b is installed in an annular space provided between an inner wall of the reaction tube 203 and the wafers 200 when viewed from above, and extends upward from a lower portion toward an upper portion of the reaction tube 203 along the inner wall of the reaction tube 203 (that is, extends upward along a wafer arrangement direction). That is, each of the nozzles 249a and 249b is installed in a region that is located beside and horizontally surrounds a wafer arrangement region in which the wafers 200 are arranged (stacked) so as to extend along the wafer arrangement region. Unlike the nozzles 249a and 249b, the nozzle 249c extends in a horizontal direction without extending upward. When viewed from above, the nozzle 249b is arranged so as to face an exhaust port 231a described later along a straight line (denoted by "L" shown in FIG. 2) with a center of the wafer 200 transferred (loaded) into the process chamber 201 interposed therebetween. The straight line L is a straight line passing through the nozzle 249b and a center of the exhaust port 231a. When viewed from above, the nozzles 249a and 249c are arranged along the inner wall of the reaction tube 203 (an outer peripheral portion of the wafer 200) such that the straight line L is interposed therebetween. The straight line L is also a straight line passing through the nozzle 249b and the center of the wafer 200. A plurality of gas supply holes 250a, a plurality of gas supply holes 250b and a gas supply hole 250c are provided at side surfaces of the nozzles 249a, 249b and 249c, respectively. Gases are supplied through the gas supply holes 250a, the gas supply holes 250b and the gas supply hole 250c. The gas supply holes 250a and the gas supply holes 250b are open toward the exhaust port 231a when viewed from above, and are configured such that the gases are supplied toward the wafer 200 through the gas supply holes 250a and the gas supply holes 250b. The gas supply holes 250a and the gas supply holes 250b are provided from the lower portion toward the upper portion of the reaction tube 203. The gas supply hole 250c is provided toward a circumferential direction.

A reactive gas is supplied into the process chamber 201 through the gas supply pipe 232a provided with the MFC 241a and the valve 243a and the nozzle 249a.

A source gas is supplied into the process chamber 201 through the gas supply pipe 232b provided with the MFC 241b and the valve 243b and the nozzle 249b.

A cleaning gas is supplied into the process chamber 201 through the gas supply pipe 232c provided with the MFC 241c and the valve 243c and the nozzle 249c.

The cleaning gas is supplied into the process chamber 201 through the gas supply pipe 232d provided with the MFC 241d and the valve 243d, the gas supply pipe 232a and the nozzle 249a.

An inert gas is supplied into the process chamber 201 through the gas supply pipes 232e, 232f and 232g provided with the MFCs 241e, 241f and 241g and the valves 243e, 243f and 243g, respectively, the gas supply pipes 232a, 232b and 232c and the nozzles 249a, 249b and 249c.

A silicon-containing substance or a nitrogen-containing substance is supplied into the process chamber 201 through the gas supply pipe 232h provided with the MFC 241h and the valve 243h, the gas supply pipe 232b and the nozzle 249b.

A reactive gas supplier (which is a reactive gas supply structure or a reactive gas supply system) is constituted mainly by the gas supply pipe 232a, the MFC 241a and the valve 243a. A source gas supplier (which is a source gas supply structure or a source gas supply system) is constituted mainly by the gas supply pipe 232b, the MFC 241b and the valve 243b. A first cleaning gas supplier (which is a first cleaning gas supply structure or a first cleaning gas supply system) is constituted mainly by the gas supply pipe 232c, the MFC 241c and the valve 243c. A second cleaning gas supplier (which is a second cleaning gas supply structure or a second cleaning gas supply system) is constituted mainly by the gas supply pipe 232d, the MFC 241d and the valve 243d. An inert gas supplier (which is an inert gas supply structure or an inert gas supply system) is constituted mainly by the gas supply pipes 232e, 232f and 232g, the MFCs 241e, 241f and 241g and the valves 243e, 243f and 243g. A silicon-containing substance supplier (which is a silicon-containing substance supply structure or a silicon-containing substance supply system) or a nitrogen-containing substance supplier (which is a nitrogen-containing substance supply structure or a nitrogen-containing substance supply system) is constituted mainly by the gas supply pipe 232h, the MFC 241h and the valve 243h.

In the present embodiments, the source gas and the reactive gas serve as a film-forming gas (that is, the process gas). Therefore, the source gas supplier and the reactive gas supplier may also be collectively or individually referred to as a "film-forming gas supplier" which is a film-forming gas supply structure or a film-forming gas supply system.

Any one or an entirety of the gas suppliers described above may be embodied as an integrated gas supply system 248 in which the components such as the valves 243a through 243h and the MFCs 241a through 241h are integrated. The integrated gas supply system 248 is connected to the respective gas supply pipes 232a through 232h. An operation of the integrated gas supply system 248 to supply various gases to the gas supply pipes 232a through 232h, for example, operations such as an operation of opening and closing the valves 243a through 243h and an operation of adjusting flow rates of the gases through the MFCs 241a through 241h may be controlled by a controller 121 which will be described later. The integrated gas supply system 248 may be embodied as an integrated structure (integrated unit) of an all-in-one type or a divided type. The integrated gas supply system 248 may be attached to or detached from the components such as the gas supply pipes 232a through 232h on a basis of the integrated structure. Operations such as maintenance, replacement and addition of the integrated gas supply system 248 may be performed on a basis of the integrated structure.

The exhaust port 231a through which an inner atmosphere of the process chamber 201 is exhausted is provided at a lower side wall of the reaction tube 203. As shown in FIG. 2, the exhaust port 231a is arranged at a location so as to face the nozzles 249a, 249b and 249c (the gas supply holes 250a, the gas supply holes 250b and the gas supply hole 250c) with the wafer 200 interposed therebetween when viewed from above. The exhaust port 231a may be provided so as to extend upward from the lower portion toward the upper portion of the reaction tube 203 along a side wall of the reaction tube 203 (that is, along the wafer arrangement region). An exhaust pipe 231 is connected to the exhaust port 231a. A vacuum pump 246 serving as a vacuum exhaust apparatus is connected to the exhaust pipe 231 through a pressure sensor 245 and an APC (Automatic Pressure Controller) valve 244. The pressure sensor 245 serves as a pressure detector (pressure detection structure) to detect an inner pressure of the process chamber 201, and the APC valve 244 serves as a pressure regulator (pressure adjusting structure). With the vacuum pump 246 in operation, the APC valve 244 may be opened or closed to vacuum-exhaust the process chamber 201 or stop the vacuum exhaust. With the vacuum pump 246 in operation, the inner pressure of the process chamber 201 may be adjusted by adjusting an opening degree of the APC valve 244 based on pressure information detected by the pressure sensor 245. An exhauster (which is an exhaust structure or an exhaust system) is constituted mainly by the exhaust pipe 231, the APC valve 244 and the pressure sensor 245. The exhauster may further include the vacuum pump 246.

A seal cap 219 serving as a furnace opening lid capable of airtightly sealing (or closing) a lower end opening of the manifold 209 is provided under the manifold 209. The seal cap 219 is capable of sealing the lower end opening of the manifold 209 when a boat 217 is rotatably supported in the process vessel. The seal cap 219 is made of a metal material such as SUS, and is of a disk shape. An O-ring 220b serving as a seal is provided on an upper surface of the seal cap 219 so as to be in contact with the lower end of the manifold 209. A rotator 267 configured to rotate the boat 217 described later is provided under the seal cap 219. A rotating shaft 255 of the rotator 267 is connected to the boat 217 through the seal cap 219. As the rotator 267 rotates the boat 217, the wafers 200 accommodated in the boat 217 are rotated. The rotator 267 is provided with an annular groove (not shown), and is configured such that a purge gas is supplied through the annular groove to the vicinity of the rotating shaft 255. As a result, it is possible to prevent the rotating shaft 255 from being corroded by the process gas in the process chamber 201. The seal cap 219 is elevated or lowered in the vertical direction by a boat elevator 115 serving as an elevator provided outside the reaction tube 203. The boat elevator 115 serves as a transfer device (which is a transfer structure or a transfer system) that loads the boat 217 and the wafers 200 accommodated in the boat 217 into the process chamber 201 or unloads the boat 217 and the wafers 200 accommodated in the boat 217 out of the process chamber 201 by elevating or lowering the seal cap 219.

A furnace opening shutter 219s serving as a furnace opening lid capable of airtightly sealing (or closing) the lower end opening of the manifold 209 is provided under the manifold 209. A furnace opening assembly is constituted mainly by the manifold 209 and the furnace opening shutter 219s. The furnace opening shutter 219s is configured to close the lower end opening of the manifold 209 when the seal cap 219 is lowered by the boat elevator 115 and the boat 217 is unloaded out of the process chamber 201. For example, the furnace opening shutter 219s is made of a metal material such as SUS, and is of a disk shape. An O-ring 220c serving as a seal is provided on an upper surface of the furnace opening shutter 219s so as to be in contact with the lower end of the manifold 209. An opening and closing operation of the furnace opening shutter 219s such as an elevation operation and a rotation operation is controlled by a shutter opener/closer (which is a shutter opening/closing structure) 115s. The furnace opening shutter 219s is different from the seal cap 219 in that a film-forming quality is not considered for the furnace opening shutter 219s and a mirror surface polishing for reducing particles is not performed on the furnace opening shutter 219s. The furnace opening shutter 219s will be described later in detail.

The boat 217 serving as a substrate retainer is configured such that the wafers 200 (for example, 25 wafers to 200 wafers) are accommodated (or supported) in the vertical direction in the boat 217 while the wafers 200 are horizontally oriented with their centers aligned with one another with a predetermined interval therebetween in a multistage manner. For example, the boat 217 is made of a heat resistant material such as quartz and SiC. For example, a plurality of heat insulation plates 218 made of a heat resistant material such as quartz and SiC are supported at a lower portion of the boat 217 in a multistage manner.

A temperature sensor 263 serving as a temperature detector is installed in the reaction tube 203. A state of electric conduction to the heater 207 is adjusted based on temperature information detected by the temperature sensor 263 such that a desired temperature distribution of an inner temperature of the process chamber 201 can be obtained. The temperature sensor 263 is provided along the inner wall of the reaction tube 203.

Figure 3:
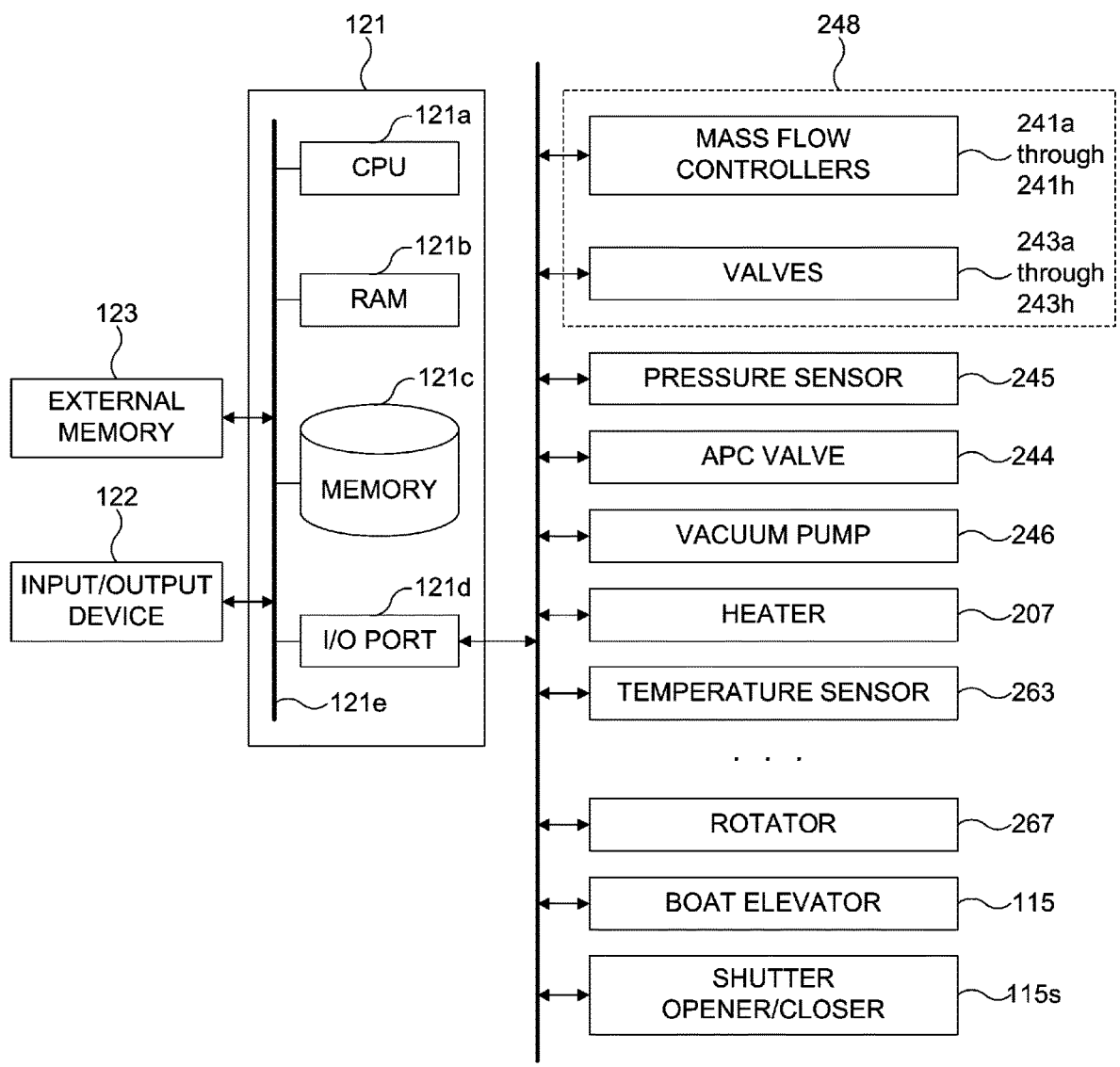
FIG. 3 is a block diagram schematically illustrating a configuration of a controller 121 and related components of the substrate processing apparatus preferably used in the embodiments of the present disclosure.

As shown in FIG. 3, the controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 constituted by a component such as a touch panel is connected to the controller 121.

The memory 121c is configured by a component such as a flash memory, a hard disk drive (HDD) and a solid state drive (SSD). For example, a control program configured to control the operation of the substrate processing apparatus or a process recipe containing information on sequences and conditions of a substrate processing described later is readably stored in the memory 121c. The process recipe is obtained by combining steps (sequences or processes) of the substrate processing described later such that the controller 121 can execute the steps to acquire a predetermined result, and functions as a program. Hereinafter, the process recipe and the control program may be collectively or individually referred to as a "program". In addition, the process recipe may also be simply referred to as a "recipe". Thus, in the present specification, the term "program" may refer to the recipe alone, may refer to the control program alone, or may refer to both of the recipe and the control program. The RAM 121b functions as a memory area (work area) where a program or data read by the CPU 121a is temporarily stored.

The I/O port 121d is connected to the above-described components such as the MFCs 241a through 241h, the valves 243a through 243h, the pressure sensor 245, the APC valve 244, the vacuum pump 246, the temperature sensor 263, the heater 207, the rotator 267, the boat elevator 115 and the shutter opener/closer 115s.

The CPU 121a is configured to read the control program from the memory 121c and execute the read control program. In addition, the CPU 121a is configured to read the recipe from the memory 121c in accordance with an operation command inputted from the input/output device 122. According to the contents of the read recipe, the CPU 121a may be configured to be capable of controlling various operations such as flow rate adjusting operations for various gases by the MFCs 241a through 241h, opening and closing operations of the valves 243a through 243h, an opening and closing operation of the APC valve 244, a pressure adjusting operation by the APC valve 244 based on the pressure sensor 245, a start and stop of the vacuum pump 246, a temperature adjusting operation by the heater 207 based on the temperature sensor 263, an operation of adjusting the rotation and the rotation speed of the boat 217 by the rotator 267, an elevating and lowering operation of the boat 217 by the boat elevator 115 and an opening and closing operation of the furnace opening shutter 219s by the shutter opener/closer 115s.

The controller 121 may be embodied by installing the above-described program stored in an external memory 123 into a computer. For example, the external memory 123 may include a magnetic disk such as a hard disk drive (HDD), an optical disk such as a CD, a magneto-optical disk such as an MO and a semiconductor memory such as a USB memory and a solid state drive (SSD). The memory 121c or the external memory 123 may be embodied by a non-transitory computer readable recording medium. Hereafter, the memory 121c and the external memory 123 may be collectively or individually referred to as a recording medium. In the present specification, the term "recording medium" may refer to the memory 121c alone, may refer to the external memory 123 alone, and may refer to both of the memory 121c and the external memory 123. Instead of the external memory 123, a communication means such as the Internet and a dedicated line may be used for providing the program to the computer.

Figure 4:
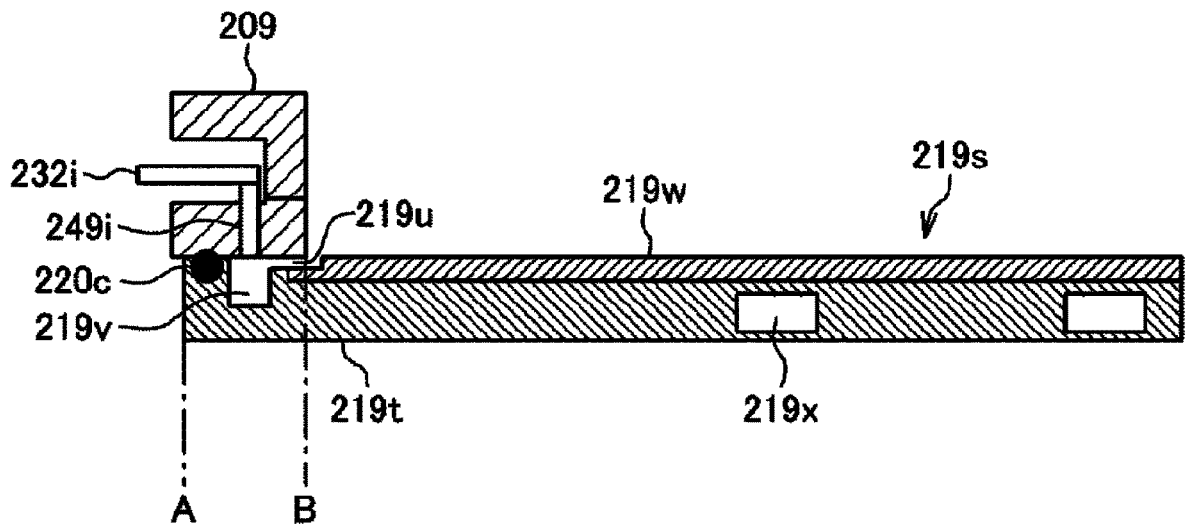
FIG. 4 is a diagram schematically illustrating a configuration of a process vessel of the substrate processing apparatus preferably used in the embodiments of the present disclosure, wherein a cross-section of a furnace opening shutter 219$s$ is schematically illustrated.
Figure 5:
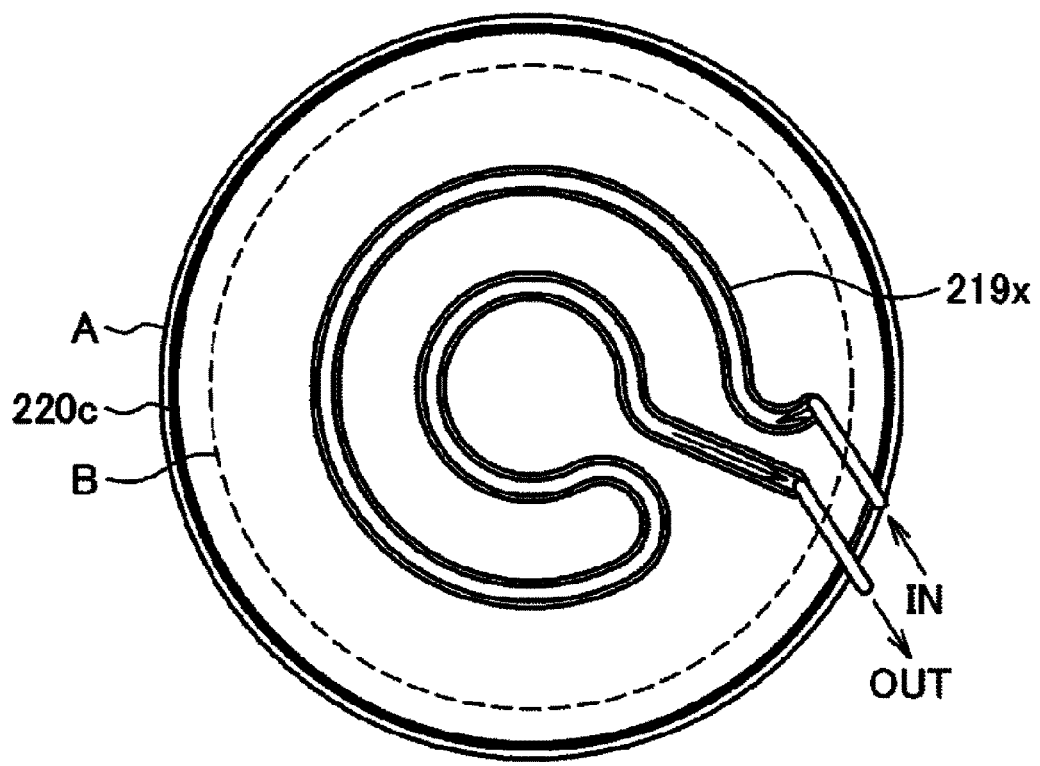
FIG. 5 is a diagram schematically illustrating a configuration of the furnace opening shutter 219$s$ of the substrate processing apparatus preferably used in the embodiments of the present disclosure, wherein a top perspective view of the furnace opening shutter 219$s$ is schematically illustrated.

Subsequently, the furnace opening shutter 219s will be described with reference to FIG. 4. The furnace opening shutter 219s may include: a protective cover 219w whose exposed surface is an inner surface of the furnace opening shutter 219s, facing an inside of the manifold 209 and greater than the lower end opening of the manifold 209; and a lid 219t whose exposed surface is an outer surface of the furnace opening shutter 219s, supporting the protective cover 219w. In the above, the "outer surface of the furnace opening shutter 219s" refers to a surface of the furnace opening shutter 219s facing an outside of the process vessel when viewed from a furnace opening, and the "inner surface of the furnace opening shutter 219s" refers to a surface of the furnace opening shutter 219s facing an inside of the process vessel when viewed from the furnace opening. The protective cover 219w is made of a material whose corrosion resistance is higher than the lid 219t. For example, the protective cover 219w is made of a material such as quartz glass, and may also be referred to as a "shutter glass" or a "quartz plate". An outer peripheral surface (also referred to as a "second sealing surface") of the furnace opening shutter 219s faces a lower surface (also referred to as a "first sealing surface") of the manifold 209. The second sealing surface is located between an outer periphery "A" of the lid 219t and an inner periphery "B" of the manifold 209, as shown in FIGS. 4 and 5, and is configured by an outer peripheral portion of the protective cover 219w and an outer peripheral portion of the lid 219t. A gap 219u is provided between the lower surface of the manifold 209 and the second sealing surface. The O-ring 220c is provided on the lid 219t at an outermost portion of the second sealing surface, and a groove 219v is formed on and along an entire circumference of the lid 219t at a portion of the second sealing surface radially more inward than the outermost portion of the second sealing surface. The outer peripheral portion of the protective cover 219w is provided on an upper surface of the lid 219t and is located radially more inward than the groove 219v.

A lower flange of the manifold 209 is configured such that a hole 249i serving as a gas introduction structure is provided at a position facing the groove 219v so as to communicate with an inside of the process chamber 201. A purge gas supply pipe 232i through which the purge gas is supplied into the process chamber 201 is connected to the hole 249i.

A purge gas supply source (not shown) is connected to an upstream side of the purge gas supply pipe 232i via a valve 243i and an MFC 241i serving as a gas flow rate controller at a location opposite to a connection location at which the purge gas supply pipe 232i is connected to the hole 249i. The purge gas is supplied through the hole 249i to the groove 219v located in the gap 219u between the lower surface of the manifold 209 and the second sealing surface, passes through the gap 219u between the lower surface of the manifold 209 and the outer peripheral portion of the protective cover 219w, and is supplied to an inner peripheral portion of the protective cover 219w. Preferably, the purge gas is supplied through the groove 219v while the cleaning gas is supplied into the process vessel. A flow rate of the purge gas supplied through the groove 219v is reduced when the cleaning gas is supplied into the process vessel as compared with a case where the cleaning gas is not supplied into the process vessel. An inner temperature of the process vessel when a cleaning process is performed may be set to be higher than that of the process vessel when the wafer 200 is processed. The groove 219v may be provided so as to face a lower surface of the lower flange of the manifold 209. Further, the gap 219u may be provided on and along the entire circumference of the lid 219t or may be provided intermittently.

The protective cover 219w is large enough to extend under the manifold 209, and the protective cover 219w is purged along an entire circumference thereof via the groove 219v provided on an outer peripheral portion of the lid 219t. By purging the protective cover 219w along the entire circumference thereof, it is possible to prevent (or suppress) the cleaning gas from entering a location between the lid 219t and the protective cover 219w (that is, a back surface of the protective cover 219w). As a result, it is possible to prevent a corrosion of the lid 219t.

Further, the lid 219t is provided with a flow path 219x of cooling water serving as a cooling medium. The flow path 219x is arranged at a central portion of the lid 219t. For example, as shown in FIGS. 4 and 5, the flow path 219x includes: a first portion located about halfway between an outer periphery and a center of the lid 219t and extending along a circumferential direction of the lid 219t; and a second portion located radially more inward than the first portion and extending along the opposite circumferential direction of the lid 219t. By supplying the cooling water through the flow path 219x, it is possible to maintain a temperature of the lid 219t within a predetermined temperature range (for example, within a range from 160° C. to 200° C.), inclusive.

Figure 6:
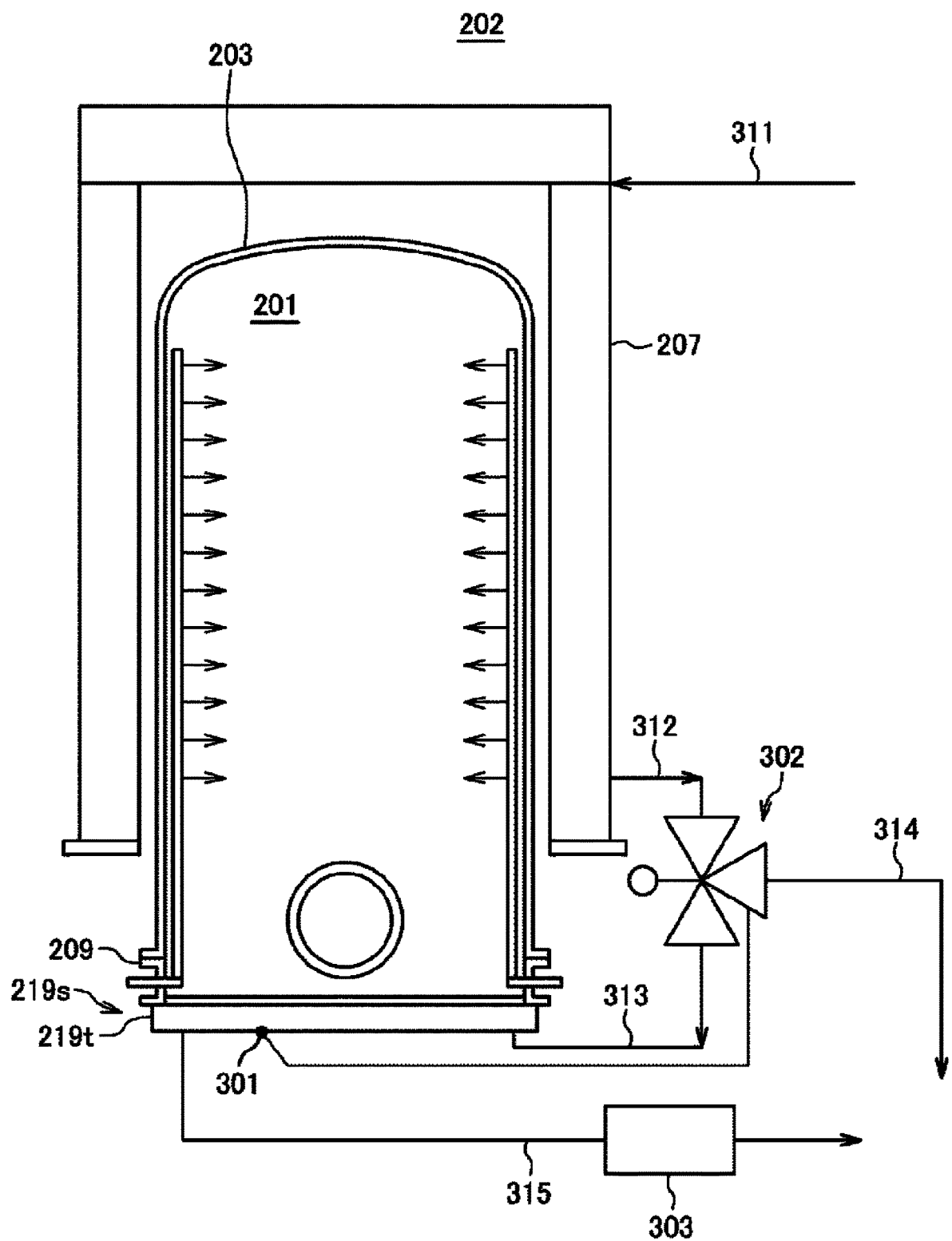
FIG. 6 is a diagram schematically illustrating a configuration of a cooling water system of the substrate processing apparatus preferably used in the embodiments of the present disclosure, wherein a portion of the process furnace 202 is schematically illustrated.

Subsequently, a cooling water system (which is a cooling water supply structure) configured to maintain the temperature of the lid 219t within the predetermined temperature range will be described with reference to FIG. 6. When a surface temperature of the furnace opening shutter 219s is equal to or less than a predetermined temperature (for example, 150° C.), a cleaning reaction rate may decrease, the cleaning gas may be condensed, or a detachment of by-products may decrease. In order to maintain the surface temperature of the furnace opening shutter 219s at a target temperature at which the cleaning process is effectively performed, a temperature control is performed by turning a supply of the cooling water on or off In addition, the cooling water already used for other components (for example, the heater 207 and its peripheries) may be reused for the lid 219t. Thereby, the surface temperature of the furnace opening shutter 219s is maintained by using such warmed cooling water.

Therefore, in order to detect a temperature of the cooling water in the flow path 219x, a temperature sensor 301 is provided in the vicinity of the flow path 219x. Although one temperature sensor 301 is illustrated in FIG. 6, a plurality of temperature sensors including the temperature sensor 301 may be provided. In addition, a cooling medium supply pipe 311 through which the cooling water is supplied is connected to the heater 207, and a discharge pipe 312 through which the cooling water warmed by cooling the heater 207 is discharged is connected to the heater 207 and a flow path switch 302. A cooling medium supply pipe 313 through which the cooling water discharged from the flow path switch 302 is supplied is connected to an inlet of the flow path 219x of the lid 219t, and a discharge pipe 315 through which the cooling water warmed by cooling the lid 219t is discharged is connected to an outlet of the flow path 219x and a flow meter 303. The flow path switch 302 switches a flow path of the cooling water based on the temperature sensor 301. For example, when the temperature of the cooling water measured by the temperature sensor 301 is equal to or higher than a predetermined temperature, the cooling water is supplied to the furnace opening shutter 219s via the cooling medium supply pipe 313. When the temperature of the cooling water is lower than the predetermined temperature, the cooling water is discharged through a discharge pipe 314 such that a flow rate of the cooling water of the lid 219t is reduced or the supply of the cooling water is stopped. For example, the flow meter 303 is configured as a Karman flow meter. The predetermined temperature is set to be equal to or less than a heat resistant temperature of the Karman flow meter, preferably 85° C.

(2) Substrate Processing

Figure 7:
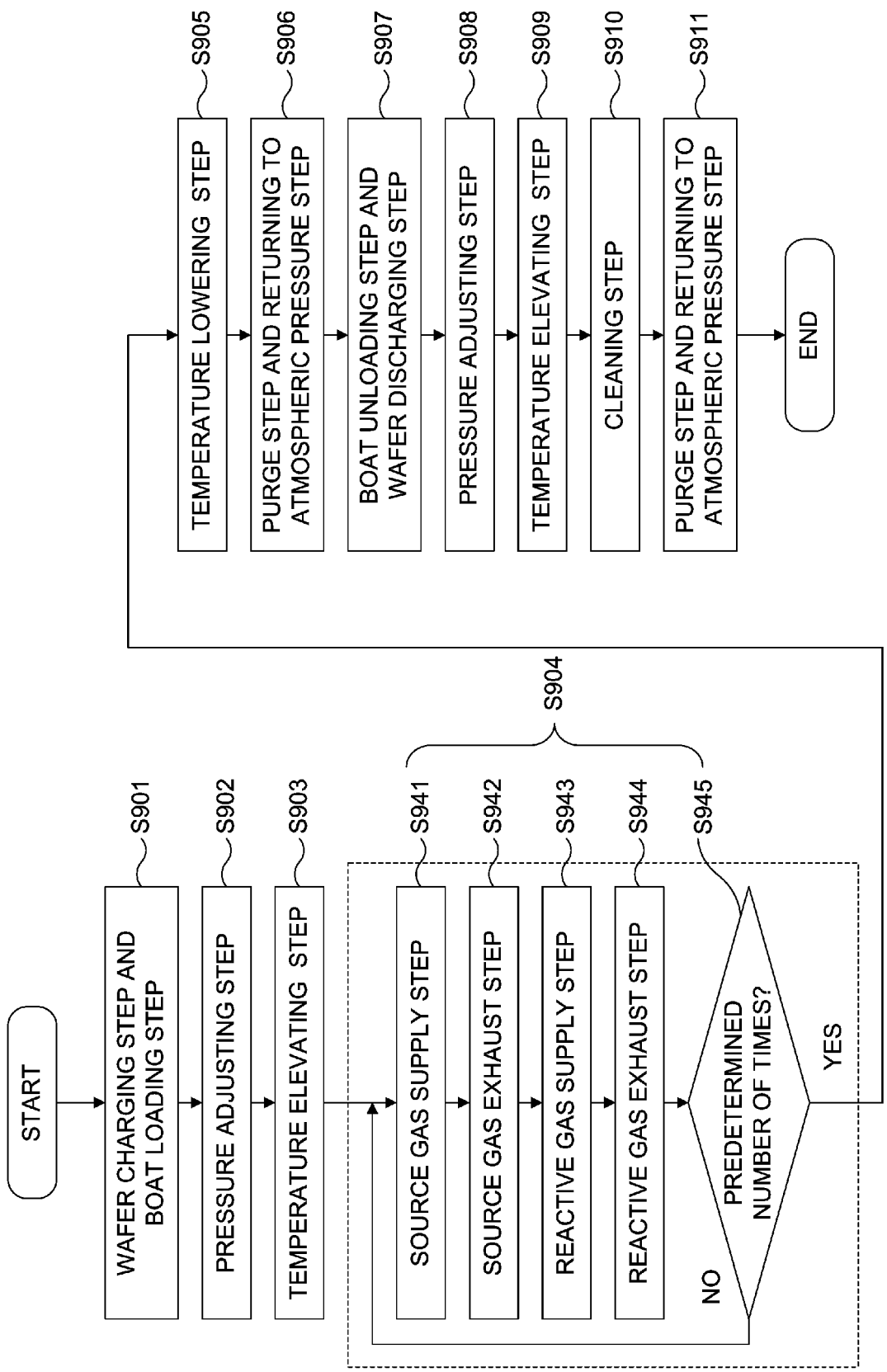
FIG. 7 is a flowchart schematically illustrating a method of manufacturing a semiconductor device according to the embodiments of the present disclosure.

Hereinafter, an example of the substrate processing such as a film-forming process of forming a predetermined film on the wafer 200 will be described with reference to FIG. 7. In the following descriptions, the operations of the components constituting the substrate processing apparatus are controlled by the controller 121.

According to the film-forming process of the present embodiments, a metal oxide film is formed on the wafer 200 by performing a cycle a predetermined number of times (at least once). For example, the cycle may include: a step S941 of supplying the source gas to the wafer 200 in the process chamber 201; a step S942 of removing the source gas (residual gas) from the process chamber 201; a step S943 of supplying the reactive gas to the wafer 200 in the process chamber 201; and a step S944 of removing the reactive gas (residual gas) from the process chamber 201. The steps S941, S942, S943 and S944 of the cycle are non-simultaneously performed.

In the present specification, the term "wafer" may refer to "a wafer itself (a bare wafer)" or may refer to "a wafer and a stacked structure (aggregated structure) of a predetermined layer (or layers) or a film (or films) formed on a surface of the wafer". Similarly, the term "a surface of a wafer" may refer to "a surface of a wafer itself" or may refer to "a surface of a predetermined layer or film formed on the wafer, that is, a top surface (uppermost surface) of the wafer as a stacked structure". In the present specification, the term "substrate" and "wafer" may be used as substantially the same meaning. That is, the term "substrate" may be substituted by "wafer" and vice versa.

<S901: Wafer Charging Step and Boat Loading Step>

First, the wafers 200 are charged (transferred) into the boat 217 (wafer charging step). Then, the furnace opening shutter 219s is moved by the shutter opener/closer 115s to open the lower end opening of the manifold 209 (shutter opening step). Thereafter, as shown in FIG. 1, the boat 217 charged with the wafers 200 is elevated by the boat elevator 115 and loaded (transferred) into the process chamber 201 (boat loading step). With the boat 217 loaded, the seal cap 219 airtightly seals the lower end of the manifold 209 via the O-ring 220*b*.

<S902: Pressure Adjusting Step>

Thereafter, the vacuum pump 246 vacuum-exhausts (decompresses and exhausts) the inner atmosphere of the process chamber 201 such that the inner pressure of the process chamber 201 in which the wafers 200 are accommodated reaches and is maintained at a desired pressure (vacuum degree) (pressure adjusting step). When the vacuum pump 246 vacuum-exhausts the inner atmosphere of the process chamber 201, the inner pressure of the process chamber 201 is measured by the pressure sensor 245, and the APC valve 244 is feedback-controlled based on the pressure information detected by the pressure sensor 245. The vacuum pump 246 continuously vacuum-exhausts the inner atmosphere of the process chamber 201 until at least the processing of the wafer 200 (that is, from a temperature elevating step S903 to a temperature lowering step S905) is completed. When the vacuum pump 246 vacuum-exhausts the inner atmosphere of the process chamber 201, the valves 243*e* through 243*g* may be opened to continuously supply the inert gas whose flow rate is adjusted by the MFCs 241*e* through 241*g* to a small flow rate to a predetermined location in the process chamber 201. The seal cap 219 distributes the purge gas supplied through the purge gas supply pipe 232*i* to the rotator 267 such that the rotator 267 is purged, and a supply amount of the purge gas to purge the rotator 267 is about 100 sccm to 1,000 sccm.

<S903: Temperature Elevating Step>

The heater 207 heats the process chamber 201 such that the temperature of the wafer 200 in the process chamber 201 reaches and is maintained at a desired process temperature (temperature elevating step). When the heater 207 heats the process chamber 201, the state of the electric conduction to the heater 207 is feedback-controlled based on the temperature information detected by the temperature sensor 263 such that the inner temperature of the process chamber 201 is stabilized at a desired temperature distribution. For example, the process temperature is set to be within a range from 100° C. to 650° C. When it is preferable to set the process temperature so as not to affect a parameter such as an impurity concentration in a channel region and a metal wiring, for example, the process temperature is set to be within a range from 100° C. to 350° C. In addition, the rotation of the wafer 200 is started by the rotator 267. The heater 207 continuously heats the wafer 200 in the process chamber 201 and the rotator 267 continuously rotates the wafer 200 until at least the processing of the wafer 200 is completed.

<S904: Film-Forming Step>

When the inner temperature of the process chamber 201 is stabilized at a predetermined process temperature, the film-forming step S904 is performed by sequentially performing the following four sub-steps, that is, the steps S941, S942, S943 and S944. During the film-forming step S904, the rotator 267 continuously rotates the boat 217 and the wafers 200 via the rotating shaft 255.

<S941: Source Gas Supply Step>

In the source gas supply step S941, by supplying the source gas to the wafer 200 in the process chamber 201, a first layer is formed on an outermost surface of the wafer 200. Specifically, the valve 243*b* is opened to supply the source gas into the gas supply pipe 232*b*. A flow rate of the source gas supplied into the gas supply pipe 232*b* is adjusted by the MFC 241*b*. Then, the source gas whose flow rate is adjusted is supplied into a process region of the process chamber 201 through the gas supply holes 250*b* of the nozzle 249*b*, and is exhausted through the exhaust pipe 231 via the exhaust port 231*a*. In the source gas supply step S941, simultaneously, the valve 243*f* is opened to supply the inert gas into the gas supply pipe 232*f*. A flow rate of the inert gas supplied into the gas supply pipe 232*f* is adjusted by the MFC 241*f*. Then, the inert gas whose flow rate is adjusted is supplied into the process region of the process chamber 201 together with the source gas through the gas supply holes 250*b* of the nozzle 249*b*, and is exhausted through the exhaust pipe 231 via the exhaust port 231*a*. In addition, simultaneously, the inert gas is supplied into the process region of the process chamber 201 through the gas supply holes 250*a* of the nozzle 249*a* and the gas supply hole 250*c* of the nozzle 249*c*, and is exhausted through the exhaust pipe 231 via the exhaust port 231*a*. In the source gas supply step S941, the controller 121 performs a constant pressure control by setting a first pressure as a target pressure. As the source gas, a gas containing a metal element such as aluminum (Al), zirconium (Zr), hafnium (Hf) and titanium (Ti) may be used.

<S942: Source Gas Exhaust Step>

After the first layer is formed, the valve 243*b* is closed to stop the supply of the source gas into the process chamber 201, and a pressure control is performed with the APC valve 244 fully opened. As a result, the inner atmosphere of the process chamber 201 is vacuum-exhausted to remove a residual gas such as the source gas in the process chamber 201 which did not react or which contributed to the formation of the first layer from the process chamber 201. In the source gas exhaust step S942, with the valve 243*f* open, the inert gas may be supplied into the process chamber 201 to further purge the residual gas. A flow rate of the purge gas (that is, the inert gas) through the nozzle 249*b* is set such that a partial pressure of a low vapor pressure gas is lower than a saturated vapor pressure in an exhaust path, or such that a flow velocity of the gas is greater than a diffusion rate of the gas in the reaction tube 203.

<S943: Reactive Gas Supply Step>

After the source gas exhaust step S942 is completed, the reactive gas is supplied to the wafer 200 in the process chamber 201 (that is, to the first layer formed on the wafer 200). In the reactive gas supply step S943, the reactive gas is thermally activated and then supplied to the wafer 200. The thermally activated reactive gas reacts with at least a portion of the first layer formed on the wafer 200 in the source gas supply step S941. As a result, the first layer is modified (changed) into a second layer. In the reactive gas supply step S943, the valves 243*a* and 243*e* are controlled in the same manners as the valves 243*b* and 243*f* in the source gas supply step S941. Specifically, a flow rate of the reactive gas is adjusted by the MFC 241*a*. The reactive gas whose flow rate is adjusted is then supplied into the process region of the process chamber 201 through the gas supply holes 250*a* of the nozzle 249*a*, and is exhausted through the exhaust pipe 231 via the exhaust port 231*a*. In addition, simultaneously, the inert gas is supplied into the process region of the process chamber 201 through the gas supply holes 250*a* of the nozzle 249*a*, the gas supply holes 250*b* of the nozzle 249*b* and the gas supply hole 250*c* of the nozzle 249*c*, and is exhausted through the exhaust pipe 231 via the exhaust port 231*a*. In the reactive gas supply step S943, the controller 121 performs the constant pressure control by setting a second pressure as the target pressure. For example, the first pressure and the second pressure may be set to a pressure within a range of 100 Pa to 5,000 Pa, preferably within a range of 100 Pa to 500 Pa. As the reactive gas, for example, an oxygen-containing gas such as oxygen ($O_2$) gas, ozone ($O_3$) gas, plasma-excited $O_2$ gas ($O_2$*), a mixed gas of the $O_2$ gas and hydrogen ($H_2$) gas, water vapor ($H_2O$ gas), hydrogen peroxide ($H_2O_2$) gas, nitrous oxide ($N_2O$) gas, nitrogen monoxide (NO) gas, nitrogen dioxide ($NO_2$) gas, carbon monoxide (CO) gas and carbon dioxide ($CO_2$) gas may be used.

<S944: Reactive Gas Exhaust Step>

After the second layer is formed, the valve 243a is closed to stop the supply of the reactive gas into the process chamber 201, and the constant pressure control (that is, a fully open control) by setting a zero (0) pressure as the target pressure is performed. As a result, the inner atmosphere of the process chamber 201 is vacuum-exhausted to remove a residual gas such as the reactive gas in the process chamber 201 which did not react or which contributed to the formation of the second layer from the process chamber 201. In the reactive gas exhaust step S944, similar to the source gas exhaust step S942, a small amount of the inert gas may be supplied into the process chamber 201 as the purge gas. The ultimate pressure in the source gas exhaust step S942 or the reactive gas exhaust step S944 may be 100 Pa or less, preferably may be set to a pressure within a range of 10 Pa to 50 Pa. The inner pressure of the process chamber 201 in the source gas supply step S941 or the reactive gas supply step S943 may be different from that of the process chamber 201 in the source gas exhaust step S942 or the reactive gas exhaust step S944 by 10 times or more.

<S945: Performing Predetermined Number of Times>

By performing the cycle a predetermined number of times (n times) wherein the steps S941 through S944 described above are performed sequentially and non-simultaneously in this order, the film with a predetermined composition and a predetermined thickness is formed on the wafer 200. Thicknesses of the first layer and the second layer formed in the steps S941 and S943, respectively, may not be self-limiting. Therefore, in order to obtain a stable film quality, it is preferable that a concentration of the gas exposed to the wafer 200 and a supply time (time duration) of the gas exposed to the wafer 200 are precisely controlled with a high reproducibility. In addition, the steps S941 and S942 or the steps S943 and S944 may be performed (repeated) a plurality of times within the cycle.

<S905: Temperature Lowering Step>

In the temperature lowering step S905, the inner temperature of the process chamber 201 is gradually lowered when necessary, for example, by stopping the temperature elevating step S903 which is continuously performed during the film-forming step S904 or by re-setting the predetermined process temperature of the temperature elevating step S903 to a lower temperature.

<S906: Purge Step and Returning to Atmospheric Pressure Step>

After the film-forming step S904 is completed, the inert gas is supplied into the process chamber 201 through each of the nozzles 249a, 249b and 249c, and then is exhausted through the exhaust port 231a. The inert gas supplied through the nozzles 249a, 249b and 249c serves as the purge gas. Thereby, the process chamber 201 is purged with the inert gas such that the residual gas or reaction by-products remaining in the process chamber 201 are removed from the process chamber 201 (purge step). Thereafter, the inner atmosphere of the process chamber 201 is replaced with the inert gas (substitution by inert gas), and the inner pressure of the process chamber 201 is returned to the atmospheric pressure (returning to atmospheric pressure step).

<S907: Boat Unloading Step and Wafer Discharging Step>

Thereafter, the seal cap 219 is lowered by the boat elevator 115 and the lower end of the manifold 209 is opened. Then, the boat 217 with the processed wafers 200 charged therein is unloaded (transferred) out of the reaction tube 203 through the lower end of the manifold 209 (boat unloading step). After the boat 217 is unloaded, the furnace opening shutter 219s is moved. Thereby, the lower end opening of the manifold 209 is sealed by the furnace opening shutter 219s through the O-ring 220c (shutter closing step). The processed wafers 200 are taken out of the reaction tube 203, and then discharged from the boat 217 (wafer discharging step).

<S908: Pressure Adjusting Step>

Thereafter, the vacuum pump 246 vacuum-exhausts (decompresses and exhausts) the inner atmosphere of the process chamber 201 such that the inner pressure of the process chamber 201 reaches and is maintained at a desired pressure (vacuum degree) (pressure adjusting step). When the vacuum pump 246 vacuum-exhausts the inner atmosphere of the process chamber 201, the inner pressure of the process chamber 201 is measured by the pressure sensor 245, and the APC valve 244 is feedback-controlled based on the pressure information detected by the pressure sensor 245. The vacuum pump 246 continuously vacuum-exhausts the inner atmosphere of the process chamber 201 until at least a cleaning step S910 is completed. While the vacuum pump 246 continuously vacuum-exhausts the inner atmosphere of the process chamber 201, the valves 243e through 243g may be opened to supply a small flow rate of the inert gas.

<S909: Temperature Elevating Step>

The heater 207 heats the process chamber 201 such that the inner temperature of the process chamber 201 reaches and is maintained at a desired process temperature (temperature elevating step). When the heater 207 heats the process chamber 201, the state of the electric conduction to the heater 207 is feedback-controlled based on the temperature information detected by the temperature sensor 263 such that a desired temperature distribution of the inner temperature of the process chamber 201 can be obtained. The heater 207 continuously heats the process chamber 201 until at least the cleaning step S910 is completed.

<S910: Cleaning Step>

When the inner temperature of the process chamber 201 is stabilized at a predetermined process temperature, the cleaning gas is supplied into the process chamber 201. Specifically, at least one among the valve 243c and the valve 243d is opened. A flow rate of the cleaning gas supplied into at least one among the gas supply pipe 232c and the gas supply pipe 232d is adjusted by at least one among the MFCs 241c and 241d. Then, the cleaning gas whose flow rate is adjusted is supplied into the process chamber 201 through at least one among the gas supply hole 250c of the nozzle 249c and the gas supply holes 250a of the nozzle 249a, and is exhausted through the exhaust pipe 231 via the exhaust port 231a. In the cleaning step S910, the controller 121 performs the constant pressure control by setting a third pressure as the target pressure. The APC valve 244 may be nearly fully closed until the inner pressure of the process chamber 201 is elevated to the third pressure. Further, the inert gas supplied into the process chamber 201 may be reduced as much as possible.

The cleaning gas is a gas containing a halogen atom. Various compounds described below may be used as the cleaning gas. As a compound containing a carbonyl group and a halogen atom in a molecule, a compound such as carbonyl fluoride ($COF_2$), carbonyl chloride ($COCl_2$), carbonyl bromide ($COBr_2$), carbonyl chloride fluoride (COClF), carbonyl bromide fluoride (COBrF) and carbonyl iodide fluoride (COIF) may be used. Further, the number of carbonyl groups in the molecule is not limited to one (1), and a compound containing two carbonyl groups such as oxalyl fluoride ($C_2O_2F_2$), oxalyl chloride ($C_2O_2Cl_2$) and oxalyl bromide ($C_2O_2Br_2$) may also be used. As a compound containing a thionyl group and the halogen atom in the molecule, a compound such as thionyl fluoride ($SOF_2$), thionyl chloride ($SOCl_2$), thionyl bromide ($SOBr_2$), thionyl tetrafluoride ($SOF_4$) and thionyl chloride bromide (SOClBr) may be used. As a compound containing a sulfuryl group and the halogen atom in the molecule, a compound such as sulfuryl chloride ($SO_2Cl_2$), sulfuryl chloride fluoride ($SO_2ClF$) and sulfuryl bromide fluoride ($SO_2BrF$) may be used. As a compound containing a nitrosyl group and the halogen atom in the molecule, a compound such as nitrosyl fluoride (NOF), nitrosyl chloride (NOCl), nitrosyl dichloride ($NOCl_2$), nitrosyl trichloride ($NOCl_3$), nitrosyl bromide (NOBr), nitrosyl dibromide ($NOBr_2$) and nitrosyl tribromide ($NOBr_3$) may be used. As a compound containing a nitrile group and the halogen atom in the molecule, a compound such as nitrile fluoride ($NO_2F$), nitrile bromide ($NO_2Br$) and nitrile chloride ($NO_2Cl$) may be used.

An oxide containing an element such as aluminum (Al), hafnium (Hf) and zirconium (Zr) formed in the film-forming step S904 is known as a high-k material. However, the oxide containing an element such as aluminum (Al), hafnium (Hf) and zirconium (Zr) is difficult to etch. When the oxide described above is converted to a chloride or a bromide whose vapor pressure is high, it is possible to etch the converted oxide without using the plasma. A cleaning process temperature (that is, the process temperature in the cleaning step S910) is set to be higher than a film-forming process temperature (that is, the process temperature in the film-forming step S904). For example, the cleaning process temperature may be set to a temperature within a range of 400° C. to 750° C. For example, the third pressure may be set to a pressure within a range of about 10 kPa to 16,600 kPa. In the cleaning step S910, the controller 121 can maintain a temperature on the inner surface of the furnace opening shutter 219s at about the target temperature by the following control. That is, when the temperature of the cooling water measured by the temperature sensor 301 exceeds a first predetermined temperature, the supply of the cooling water to the flow path 219x is forcibly turned on, and after a predetermined time "t1" or after a predetermined amount "w" of the cooling water has flowed, the supply of the cooling water to the flow path 219x is turned off. An amount of cooling water supplied through the flow path 219x is obtained by integrating values of the flow meter 303, and the predetermined amount w is determined corresponding to a volume of the flow path 219x. After the supply of the cooling water to the flow path 219x is turned off, the supply of the cooling water to the flow path 219x is maintained turned off for a predetermined time "t2" regardless of a temperature of the temperature sensor 301. Thereafter, it is waited until the temperature of the cooling water exceeds the first predetermined temperature again. In addition, a second temperature sensor (not shown) configured to measure a temperature on an inner surface of the lid 219t may be added. In such a case, when a temperature measured by the second temperature sensor exceeds a second predetermined temperature, the supply of the cooling water to the flow path 219x is forcibly turned on. The control using the temperature sensor 301 and the control using the second temperature sensor may be performed in parallel.

<S911: Purge Step and Returning to Atmospheric Pressure Step>

After the cleaning step S910 is completed, the inert gas is supplied into the process chamber 201 through each of the nozzles 249a, 249b and 249c, and then is exhausted through the exhaust port 231a. The inert gas supplied through the nozzles 249a, 249b and 249c serves as the purge gas. Thereby, the process chamber 201 is purged with the inert gas such that the residual gas or the reaction by-products remaining in the process chamber 201 are removed from the process chamber 201 (after-purge step). Thereafter, the inner atmosphere of the process chamber 201 is replaced with the inert gas (substitution by inert gas), and the inner pressure of the process chamber 201 is returned to the atmospheric pressure (returning to atmospheric pressure step).

<Other Embodiments>

While the technique of the present disclosure is described in detail by way of the embodiments described above, the technique of the present disclosure is not limited thereto. The technique of the present disclosure may be modified in various ways without departing from the scope thereof. Those skilled in the art may widely apply the embodiments described above to a heat treatment process of the substrate under a depressurized state. For example, the technique of the present disclosure is not limited to a hot wall type reaction tube, and may be applied to a cold wall type reaction tube by using a lamp heating or induction heating. For example, the technique of the present disclosure may be applied to various types of reaction tubes such as a single tube type reaction tube shown in FIG. 1, a reaction tube with a buffer (duct) and a double tube type reaction tube.

The film-forming process is not limited to that performed on the substrate such as the wafer. For example, the film-forming process may be performed on an inner wall of a chamber (process vessel) so as to protect the chamber and to prevent the particles from being generated. The furnace opening shutter according to the technique of the present disclosure may be used for coating (or re-coating) and removing an existing protective film before coating.

According to some embodiments of the present disclosure, it is possible to reduce the corrosion of the furnace opening shutter.

What is claimed is:

1. A substrate processing apparatus comprising:
a process vessel provided with an opening through which a substrate retainer accommodating a substrate is transferred and a first sealing surface around the opening; and
a furnace opening shutter provided with a second sealing surface facing the first sealing surface, and capable of closing the opening in a state where the substrate retainer is not accommodated in the process vessel,
wherein the furnace opening shutter comprises:
a protective cover corresponding to an inner surface of the furnace opening shutter, facing the process vessel and greater than the opening; and
a lid corresponding to an outer surface of the furnace opening shutter and supporting the protective cover,
wherein the second sealing surface is constituted by an outer peripheral portion of the protective cover and the lid, and
a gap is formed between the first sealing surface and the second sealing surface for a purge gas to be supplied thereto from a location radially more outward than the outer peripheral portion of the protective cover.

2. The substrate processing apparatus of claim 1, wherein the process vessel or the furnace opening shutter is provided with a groove through which the purge gas is supplied to the gap from the location radially more outward than the outer peripheral portion of the protective cover, and the protective cover is provided with an inner peripheral portion such that the purge gas after passing through the gap is capable of being supplied to the inner peripheral portion of the protective cover.

3. The substrate processing apparatus of claim 1, wherein the lid comprises a flow path of a cooling medium for a temperature of the lid to be maintained within a predetermined temperature range.

4. The substrate processing apparatus of claim 1, wherein the lid comprises:

a flow path of a cooling medium capable of maintaining a temperature of the lid within a predetermined temperature range; and a temperature sensor configured to detect a temperature of the cooling medium in the flow path.

5. The substrate processing apparatus of claim 4, wherein the lid further comprises a flow path switch configured to switch the flow path of the cooling medium such that the cooling medium is supplied to the flow path when the temperature of the cooling medium is equal to or higher than a predetermined temperature, and a supply of the cooling medium is reduced or stopped when the temperature of the cooling medium is lower than the predetermined temperature.

6. The substrate processing apparatus of claim 4, further comprising a heater configured to heat the substrate, wherein the cooling medium after cooling the heater or its peripheries is supplied to the flow path.

7. The substrate processing apparatus of claim 4, wherein the flow path is provided at a central portion of the lid.

8. The substrate processing apparatus of claim 2, further comprising a purge gas supply pipe configured to supply the purge gas through the groove while a cleaning gas is being supplied into the process vessel.

9. The substrate processing apparatus of claim 8, further comprising a heater configured to heat the substrate such that a process temperature is higher when the cleaning gas is supplied than when the substrate is processed.

10. The substrate processing apparatus of claim 2, further comprising a purge gas supply pipe and a flow rate controller configured to supply the purge gas through the groove such that a flow rate of the purge gas supplied through the groove is smaller when a cleaning gas is supplied into the process vessel than when the cleaning gas is not supplied into the process vessel.

11. The substrate processing apparatus of claim 1, further comprising:

a seal cap capable of closing the opening in a state where the substrate retainer is rotatable and supported in the process vessel; and a rotator provided on the seal cap to rotate the substrate retainer, wherein the rotator is configured such that the purge gas is supplied to a vicinity of a rotating shaft of the rotator through an annular groove.

12. The substrate processing apparatus of claim 4, wherein the predetermined temperature range is within a range from 160° C. to 200° C., inclusive, and the cooling medium comprises water.

13. A furnace opening assembly comprising:

a manifold constituting a furnace opening of a process vessel, and provided with an opening through which a substrate retainer accommodating a substrate is transferred and a first sealing surface around the opening; and a furnace opening shutter provided with a second sealing surface facing the first sealing surface, and capable of closing the opening in a state where the substrate retainer is not accommodated in the process vessel, wherein the furnace opening shutter comprises:

a protective cover provided corresponding to an inner surface of the furnace opening shutter facing the process vessel and greater than the opening; and a lid provided corresponding to an outer surface of the furnace opening shutter and supporting the protective cover, wherein the second sealing surface is constituted by an outer peripheral portion of the protective cover and the lid, and a gap is formed between the first sealing surface and the second sealing surface for a purge gas to be supplied thereto from a location radially more outward than the outer peripheral portion of the protective cover.

14. The substrate processing apparatus of claim 2, further comprising:

a gas introduction hole penetrating a lower flange of a manifold and the opening on the first sealing surface at a position facing the groove that is provided at the lid.

* * * * *